(12) United States Patent
Fujihara

(10) Patent No.: US 11,761,704 B2
(45) Date of Patent: Sep. 19, 2023

(54) INSPECTION APPARATUS AND INSPECTION METHOD

(71) Applicant: Tokyo Electron Limited, Tokyo (JP)

(72) Inventor: Jun Fujihara, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 178 days.

(21) Appl. No.: 17/330,781

(22) Filed: May 26, 2021

(65) Prior Publication Data
US 2021/0372695 A1 Dec. 2, 2021

(30) Foreign Application Priority Data

Jun. 2, 2020 (JP) .................................. 2020-096381

(51) Int. Cl.
*F25J 1/02* (2006.01)
*F28D 9/00* (2006.01)
(Continued)

(52) U.S. Cl.
CPC ...... *F25J 1/02* (2013.01); *F28D 9/00* (2013.01); *G01R 31/2877* (2013.01); *H01L 21/67248* (2013.01)

(58) Field of Classification Search
CPC ........ H01L 21/67248; H01L 21/67109; G01R 31/2877; F28D 9/00; F25J 1/02
See application file for complete search history.

(56) References Cited

U.S. PATENT DOCUMENTS

2003/0045131 A1* 3/2003 Verbeke ............ H01L 21/67167
438/795
2007/0093071 A1* 4/2007 Verhaverbeke ... H01L 21/67173
430/269
(Continued)

FOREIGN PATENT DOCUMENTS

JP          2842928 B2     1/1999
JP     2006131966 A  *  5/2006   ......... C23C 16/4404
(Continued)

OTHER PUBLICATIONS

Translation of Japanese Patent Document JP2013167474A entitled TRANSLATION-JP2013167474A (Year: 2013).*

*Primary Examiner* — Paul Alvare
(74) *Attorney, Agent, or Firm* — Nath, Goldberg & Meyer; Jerald L. Meyer; Tanya E. Harkins

(57) ABSTRACT

An inspection apparatus includes: inspection chamber rows in each of which inspection chambers are arranged, the inspection chamber rows arranged in multiple stages and each of the inspection chambers being configured to accommodate therein a tester configured to inspect an inspection object on a chuck top; a refrigerant supplier configured to supply a refrigerant gas; and a controller. The refrigerant supplier includes: a refrigerant gas pipe connecting the chuck tops in each inspection chamber row to allow the refrigerant gas to pass therethrough; and a first heat exchanger disposed in the refrigerant gas pipe between the chuck tops to exchange heat with the refrigerant gas discharged from the chuck tops. Each of the chuck tops includes a heater configured to heat the inspection object and a temperature sensor. The controller is configured to control the heater based on a temperature detected by the temperature sensor.

6 Claims, 5 Drawing Sheets

(51) Int. Cl.
*H01L 21/67* (2006.01)
*G01R 31/28* (2006.01)

(56) References Cited

U.S. PATENT DOCUMENTS

| | | | | |
|---|---|---|---|---|
| 2011/0068084 A1* | 3/2011 | Tatsuhiko | ........... | H01L 21/6831 |
| | | | | 156/345.52 |
| 2011/0316571 A1* | 12/2011 | Kiyokawa | .......... | G01R 31/2893 |
| | | | | 324/750.16 |
| 2013/0205804 A1* | 8/2013 | Maeda | ...................... | F17C 9/02 |
| | | | | 62/48.1 |
| 2019/0041454 A1* | 2/2019 | Akiyama | ........... | G01R 31/2881 |

FOREIGN PATENT DOCUMENTS

| JP | 2013-167474 A | | 8/2013 |
|---|---|---|---|
| JP | 2013167474 A | * | 8/2013 |
| JP | 2013221911 A | * | 10/2013 |
| JP | 2014192218 A | * | 10/2014 |
| JP | 2015061021 A | * | 3/2015 |

* cited by examiner

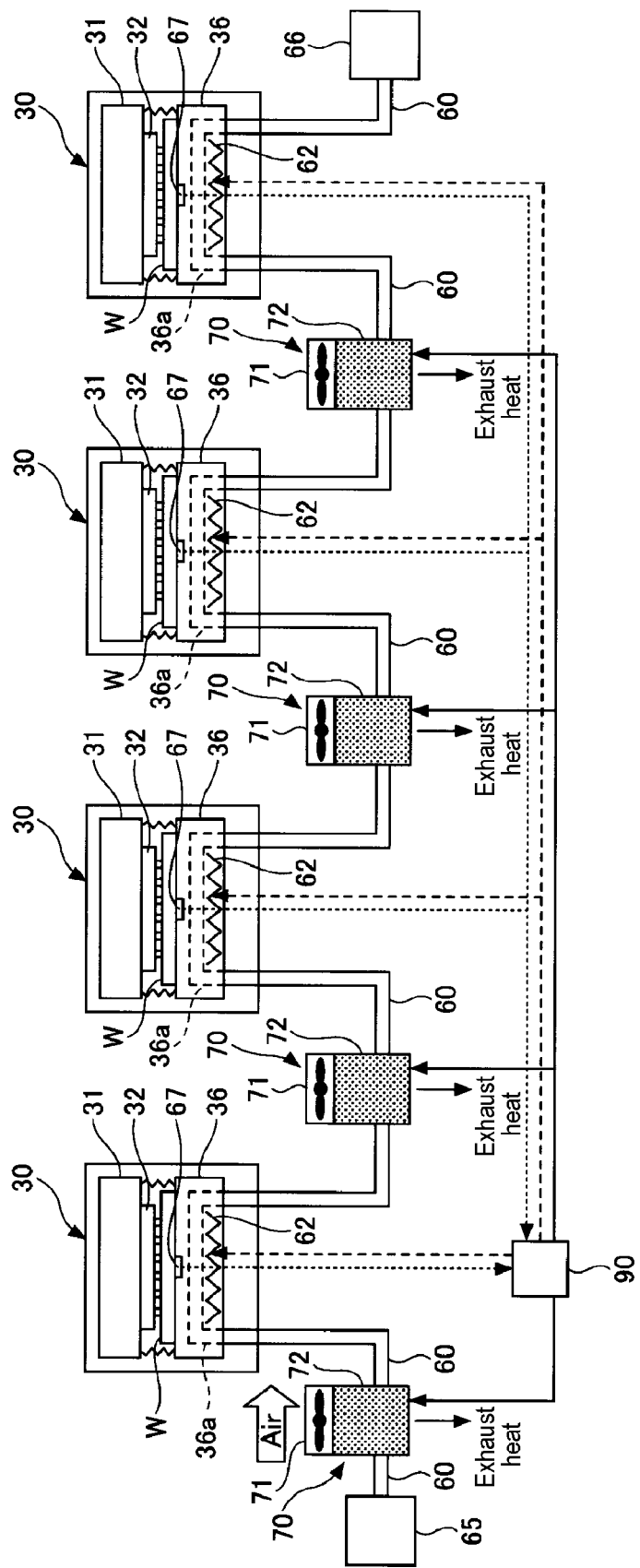

INSPECTION APPARATUS AND INSPECTION METHOD

CROSS-REFERENCE TO RELATED APPLICATION

This application is based upon and claims the benefit of priority from Japanese Patent Application No. 2020-096381, filed on Jun. 2, 2020, the entire contents of which are incorporated herein by reference.

TECHNICAL FIELD

The present disclosure relates to an inspection apparatus and an inspection method.

BACKGROUND

For example, Patent Document 1 discloses a low-temperature nitrogen heat exchanger, which cools compressed air using low-temperature nitrogen gas, which is a gas having a temperature lower than room temperature. Compressed air cooled by the low-temperature nitrogen heat exchanger is supplied to a stage. The stage has a heater that heats the stage and a temperature sensor that detects the temperature of a chuck top of the stage. A valve is installed in a supply path for supplying the low temperature nitrogen gas to the low-temperature nitrogen heat exchanger. A controller controls the opening and closing of the valve so as to control the flow rate of the low-temperature nitrogen gas supplied to the low-temperature nitrogen heat exchanger and controls the output of the heater, thereby making the temperature detected by the temperature sensor reach a predetermined temperature.

PRIOR ART DOCUMENT

Patent Document

Patent Document 1: Japanese Laid-Open Patent Publication No. 2013-167474

SUMMARY

According to one embodiment of the present disclosure, there is provided an inspection apparatus includes: inspection chamber rows in each of which inspection chambers are arranged, the inspection chamber rows arranged in multiple stages and each of the inspection chambers being configured to accommodate therein a tester configured to inspect an inspection object on a chuck top; a refrigerant supplier configured to supply a refrigerant gas; and a controller. The refrigerant supplier includes: a refrigerant gas pipe connecting the chuck tops in each inspection chamber row to allow the refrigerant gas to pass therethrough; and a first heat exchanger disposed in the refrigerant gas pipe between the chuck tops to exchange heat with the refrigerant gas discharged from the chuck tops. Each of the chuck tops includes a heater configured to heat the inspection object and a temperature sensor. The controller is configured to control the heater based on a temperature detected by the temperature sensor.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 5 is a view illustrating a refrigerant supplier in an inspection chamber in a first stage shown in FIG. 2.

DETAILED DESCRIPTION

Figure 1:
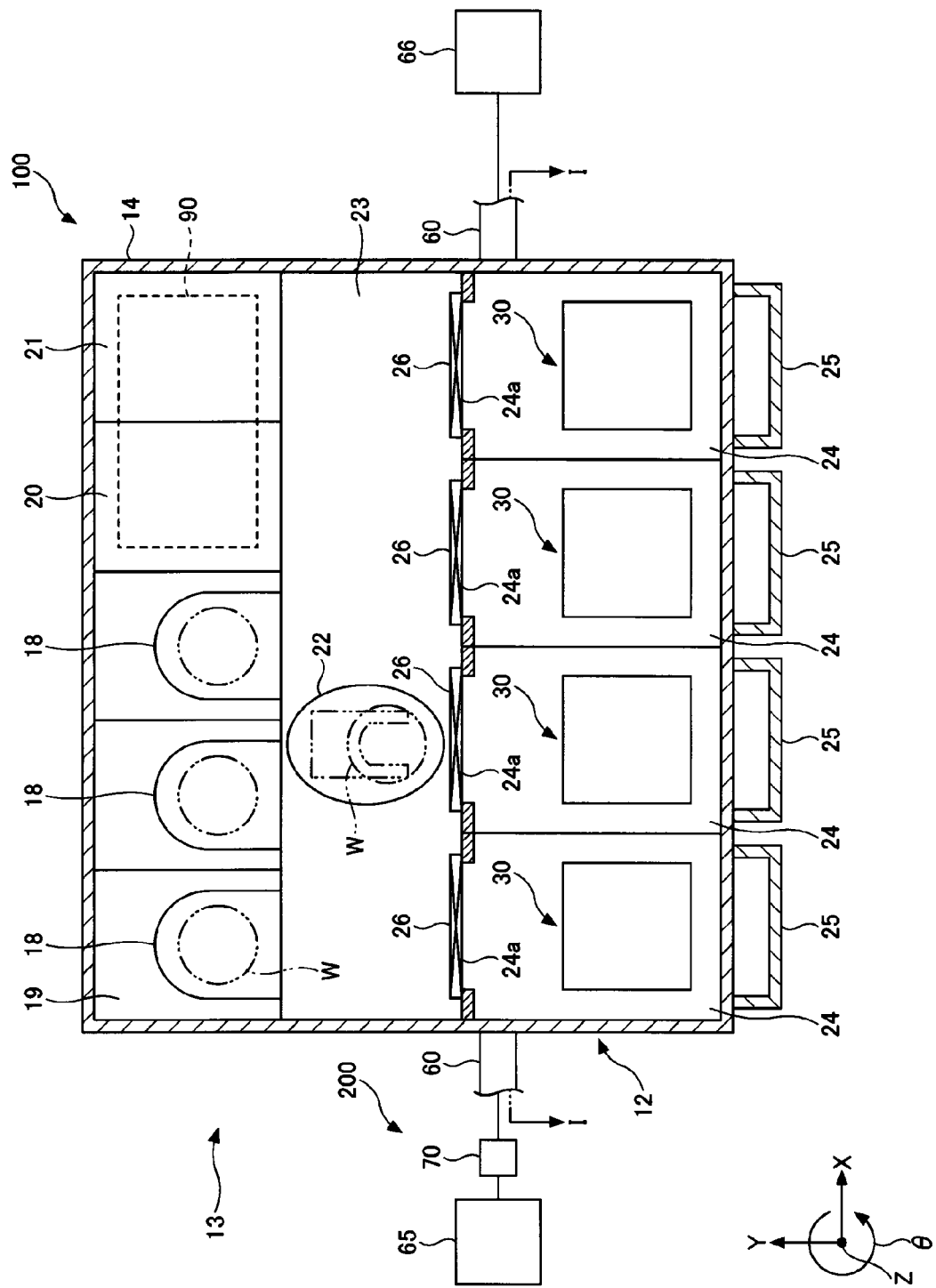
FIG. 1 is a view illustrating an exemplary inspection system according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In each of the drawings, the same components are denoted by the same reference numerals, and redundant descriptions may be omitted.

[Inspection System]

Figure 2:
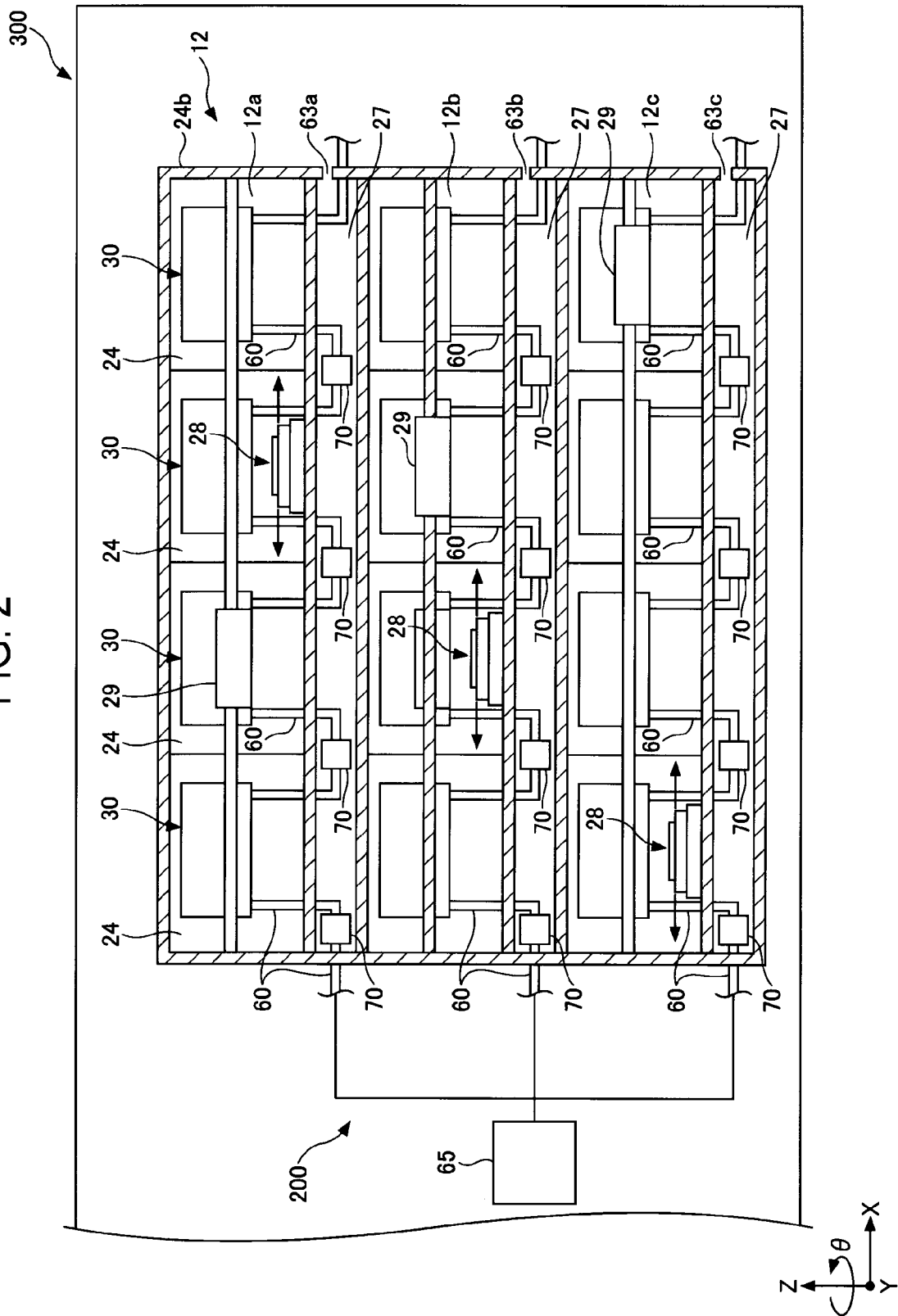
FIG. 2 is a cross-sectional view of the inspection system shown FIG. 1 taken along line I-I.
Figure 3:
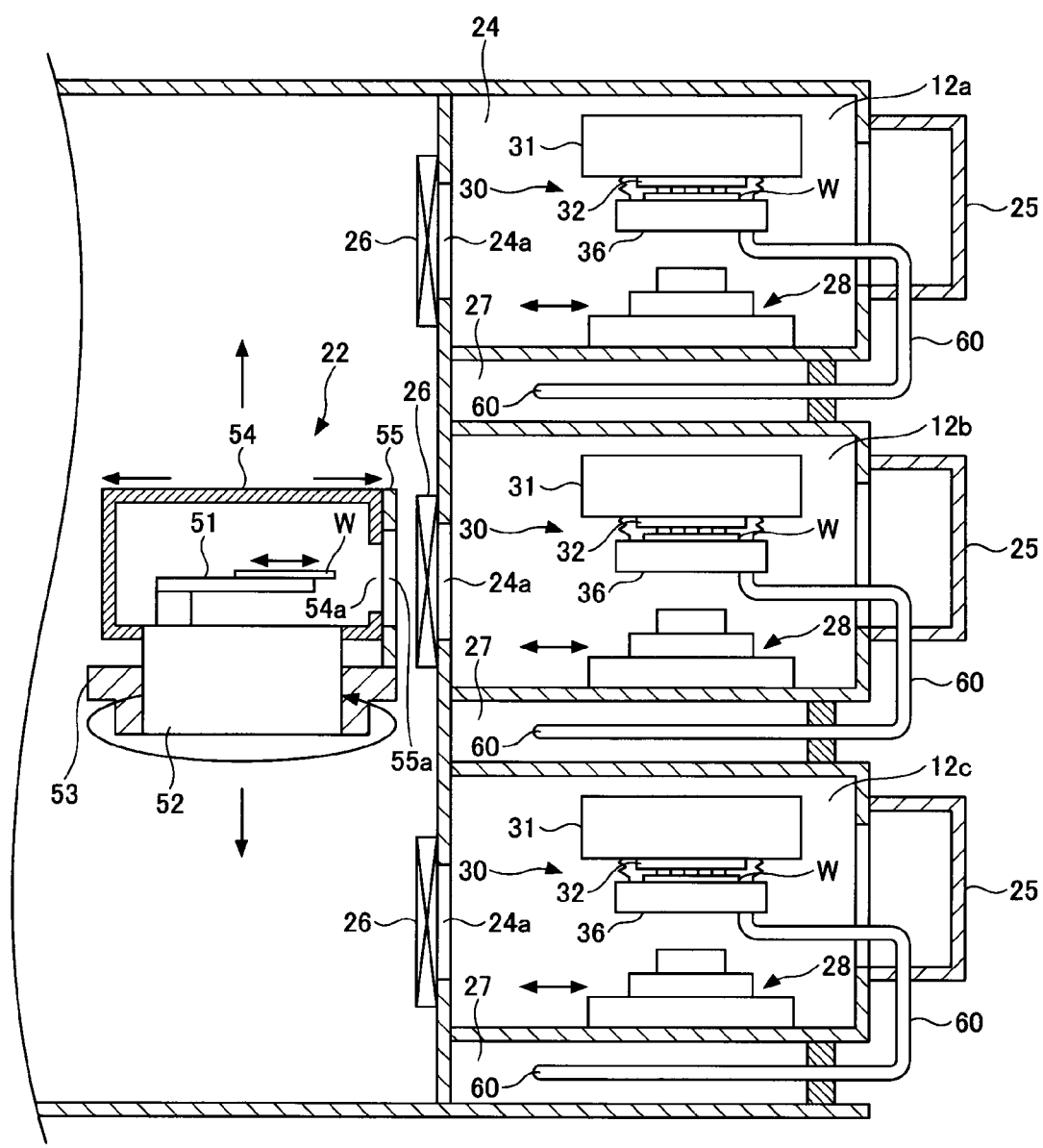
FIG. 3 is a cross-sectional view of the inspection system shown FIG. 1 taken along the Y-direction.

An inspection system 100 according to an embodiment will be described with reference to FIGS. 1 to 3. FIG. 1 is a horizontal cross-sectional view illustrating an exemplary inspection system 100 according to an embodiment. FIG. 2 is a cross-sectional view of the inspection system 100 shown in FIG. 1 taken along line I-I. FIG. 3 is a cross-sectional view of the inspection system 100 shown in FIG. 1 taken along the Y-direction.

As illustrated in FIG. 1, the inspection system 100 includes an inspection section 12 (an inspection apparatus) having inspection units 30 configured to perform electrical inspection on a wafer (devices formed on the wafer), and a loader unit 13 configured to transport a wafer to the inspection section 12. The inspection section 12 and the loader unit 13 are connected to each other. In the inspection section 12, a rear side opposite to the loader unit 13 is a maintenance side.

A refrigerant supplier 200 supplies a refrigerant gas to each inspection chamber row in the inspection section 12. The refrigerant supplier 200 includes a refrigerant gas output 65, a heat exchanger 70, a refrigerant gas pipe 60, and an exhaust heat processing part 66, and the refrigerant gas pipe 60 extends in the inspection system 100.

As illustrated in FIG. 2, in the inspection section 12, four inspection chambers 24 are arranged in a row in the X direction, and such inspection chamber rows are arranged in three stages in the Z direction (vertical direction). That is, the inspection system 100 has 12 inspection units 30 in the 12-divided inspection chambers 24, and inspection chamber rows, each of which includes 4 inspection chambers, are arranged in three stages. The 12 inspection chambers 24 are arranged in a clean room 300.

The inspection chamber rows of each stage communicate with each other to form an inspection space which is a substantially closed space, and form an upper inspection space 12a, a middle inspection space 12b, and a lower inspection space 12c. Refrigerant pipe arrangement spaces 27, in which the refrigerant gas pipes 60 extending from the refrigerant supplier 200 are arranged, are formed between the upper inspection space 12a and the middle inspection space 12b, between the middle inspection space 12b and the lower inspection space 12c, and below the lower inspection space 12c. The refrigerant gas pipes 60 in the refrigerant pipe arrangement spaces 27 are arranged such that one refrigerant gas pipe 60 is arranged to correspond to each of the upper inspection space 12a, the middle inspection space 12b, and the lower inspection space 12c and one refrigerant gas pipe 60 connects, in series, four inspection units (probers) 30 in the corresponding inspection chamber row.

An inspection unit 30 is installed in each inspection chamber 24. As shown in FIG. 3, the inspection unit 30 incorporates a tester 31 for wafer inspection, a probe card 32, and a chuck top (a wafer stage) 36 configured to hold a wafer W.

As illustrated in FIG. 2, one aligner (a stage) 28 movable in the X direction is installed below the inspection unit 30 in each of the upper inspection space 12a, the middle inspection space 12b, and the lower inspection space 12c. The aligner 28 performs attachment/detachment and positioning of the wafer W with respect to the four inspection units 30 arranged in the X direction. In addition, one alignment camera 29 is installed in each of the upper inspection space 12a, the middle inspection space 12b, and the lower inspection space 12c to be movable in the X direction.

On the rear side of each inspection chamber 24, a cell controller 25, which is a control device for each inspection unit 30 illustrated in FIGS. 1 and 3, is installed. The cell controller 25 includes a solenoid, a vacuum sensor, an electropneumatic regulator, an E-IOM board, a temperature controller, and the like. The E-IOM board, the temperature controller, etc., which are electric devices, and the solenoid, the vacuum sensor, the electro-pneumatic regulator, which are air/vacuum apparatuses, are arranged in the state of being separated from each other. In addition, a transport port 24a is formed in the front surface of each inspection chamber 24, and the transport port 24a is configured to be opened and closed by a shutter 26. The inspection chamber 24 and the cell controller 25 are in communication with each other.

As illustrated in FIG. 1, the loader unit 13 includes a placement stage 19, a loading/unloading section 14, and a transport chamber 23 installed between the loading/unloading section 14 and the inspection section 12. On the placement stage 19, a FOUP 18, which is a container for accommodating wafers W, is placed to face the inspection section 12. A probe card loader 20 and a positioning part 21 configured to position the wafer W are arranged in the X direction in the loading/unloading section 14. A controller 90 is installed inside the loading/unloading section 14. In the transport chamber 23, a transport mechanism 22 runs to transport the wafer W.

As illustrated in FIG. 3, the transport mechanism 22 includes a transport arm 51, a rotary driver 52, a base 53, a cover member 54, and a frame-shaped member 55. In addition, the transport mechanism 22 includes a shielding wall (not illustrated) provided integrally with the frame-shaped member 55 to cover a part of the outer periphery of the cover member 54.

The rotary driver 52 supports the transport arm 51, which supports the wafer W, and rotates the transport arm 51. The base 53 supports the rotary driver 52. The cover member 54 is a cylindrical container that is supported by the rotary driver 52 and covers the transport arm 51. The frame-shaped member 55 is fixed to the base 53 on the inspection section 12 side, and includes a transport port 55a for transporting the wafer W. The cover member 54 is rotated together with the transport arm 51 by the rotary driver 52, and includes a transport port 54a for transporting the wafer W.

The transport mechanism 22 is installed to be movable in the Z direction and the X direction, receives a wafer W before inspection from the FOUP 18 and transports the wafer W to the inspection chamber 24 in each stage through the forward/rearward movement and the rotation in the θ direction of the transport arm 51. In addition, the transport mechanism 22 receives a wafer W after inspection and returns the wafer W to FOUP 18. In addition, the transport mechanism 22 transports a probe card requiring maintenance from each inspection unit 30 to the probe card loader 20, and also transports a new probe card to which the maintenance was performed to each inspection unit 30.

[Configuration of Inspection Unit]

Figure 4:
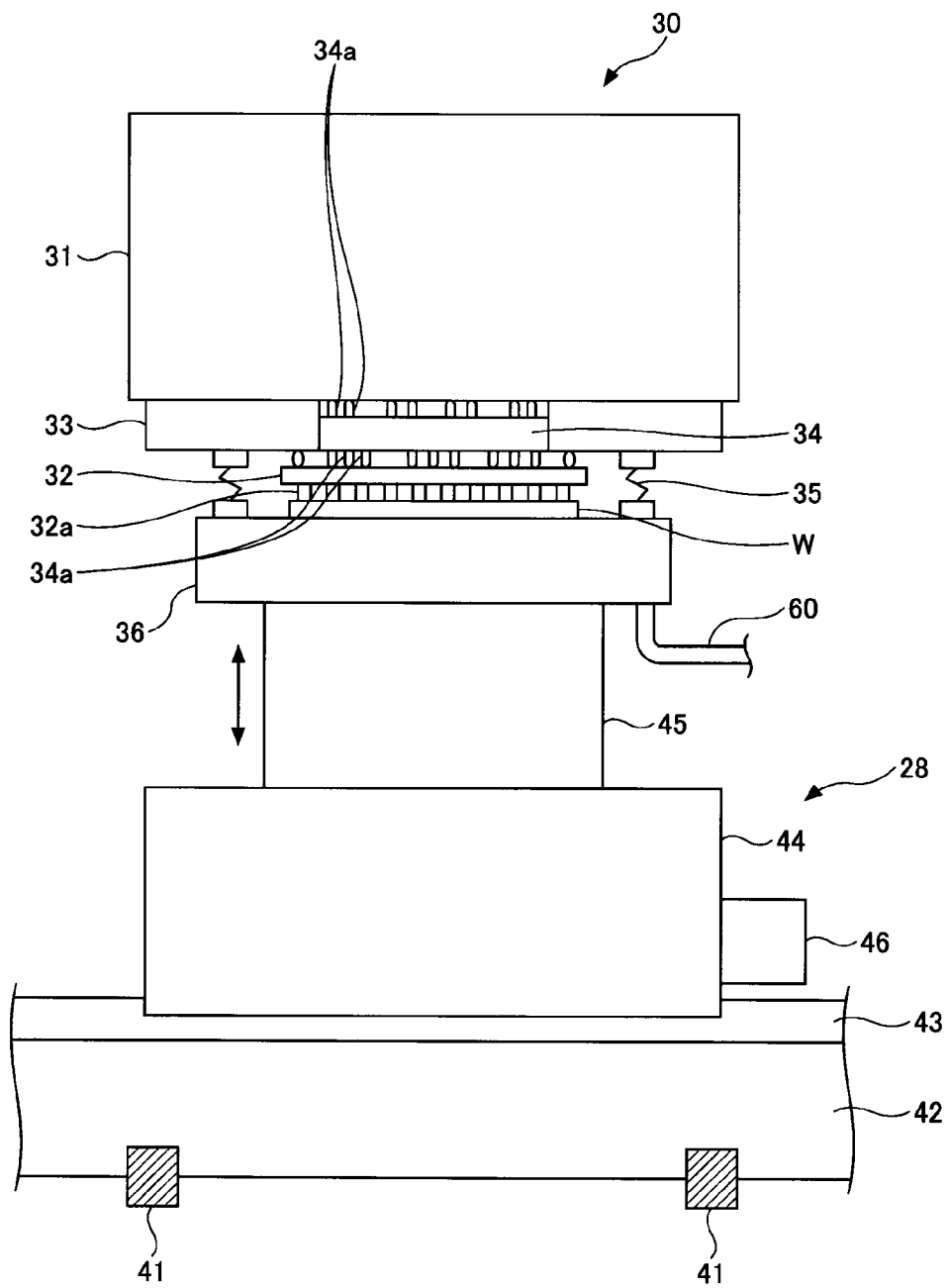
FIG. 4 is a view schematically illustrating the configuration of an inspection unit of the inspection system shown FIG. 1.

The configuration of the inspection unit 30 will be described in detail with reference to FIG. 4. FIG. 4 is a view illustrating a schematic configuration of the inspection unit 30. The inspection unit 30 includes a tester 31, a probe card 32, a support plate 33, a contact block 34, a bellows 35, and a chuck top 36. The tester 31 sends an inspection signal to devices formed on the wafer W. The probe card 32 has probes 32a configured to come into contact with electrodes of devices formed on the wafer W. The support plate 33 is installed under the tester 31 and supports the probe card 32. The contact block 34 connects the tester 31 and the probe card 32. The bellows 35 hangs from the support plate 33, and is installed to surround the probe card 32. The chuck top 36 suctions and supports the wafer W by vacuum suction and controls the temperature of the wafer W.

A large number of pogo pins 34a configured to electrically connect the probe card 32 to the tester 31 are installed on the top and bottom surfaces of the contact block 34. The bellows 35 forms a substantially sealed space including the probe card 32 and the wafer W in the state in which the wafer W on the chuck top 36 is in contact with the probes 32a of the probe card 32. The chuck top 36 is suctioned to the support plate 33 by evacuating the substantially sealed space through the vacuum line. The probe card 32 is also suctioned to the support plate 33 by performing evacuation in the same manner.

The aligner 28 includes an X block 42 configured to move in the X direction on a guide rail 41 installed on the base plate of the stage. The aligner 28 further includes a Y block 44 configured to move in the Y direction on a guide rail 43 installed on the X block 42 along the Y direction. The aligner 28 further includes a Z block 45 configured to move in the Z direction with respect to the Y block 44, and the chuck top 36 is engaged with the Z block 45 in the state of maintaining a predetermined positional relationship. A lower camera 46 is installed on the peripheral wall of the Y block 44 in order to capture an image of the bottom surface of the probe card 32.

The aligner 28 is capable of accessing each inspection unit 30 by moving the X block 42 in the X direction. The aligner 28 moves the chuck top 36 on which the wafer W is placed in the X, Y, and Z directions by moving the X block 42, the Y block 44, and the Z block 45 using a moving mechanism. As a result, the wafer W, which is an object to be inspected, is positioned with respect to each inspection unit 30. In addition, the aligner 28 performs mounting of the wafer W placed on the chuck top 36 on the probe card 32, separation of the wafer W placed on the chuck top 36 from the probe card 32, delivery of the wafer W to and from the transport mechanism 22, and the like.

When the wafer W is transported to the chuck top 36 and the wafer W is mounted on the probe card 32, the wafer W is received from the transport mechanism 22 by the chuck top 36 on the aligner 28, and then the wafer W is positioned with respect to the probe card 32. Next, the chuck top 36 is raised by the aligner 28 to bring the wafer W into contact with the probes 32a of the probe card 32, and then the chuck top 36 is further raised to press the wafer W against the probes 32a. In this state, the space surrounded by the bellows 35 is evacuated so as to suction the chuck top 36 to the support plate 33, and the wafer W is maintained in the state of being pressed against the probes 32a. In this state, an electrical inspection is started by the tester 31. At this time, the Z block 45 of the aligner 28 is retracted downward. The aligner 28 is moved to another inspection unit 30 in which the inspection has been completed, lowers the inspected chuck top 36 through the operation performed in reverse to the above-described operation, and returns the wafer W inspected by the chuck top 36 to the FOUP 18 using the transport mechanism 22.

The controller 90 is configured with a computer, and controls each component of the inspection system 100, for example, the tester 31 of each inspection unit 30, a vacuum suction mechanism, the aligner 28, the transport mechanism 22, the heat exchanger 70, and a heater 62, the supply of the refrigerant gas from the refrigerant gas output 65, and the like. The controller 90 includes a main controller having a CPU, an input device (e.g., a keyboard or a mouse), an output device (e.g., a printer), a display device (e.g., a display), and a storage device (e.g., a storage medium). The main controller of the controller 90 causes the inspection system 100 to perform a predetermined operation on the basis of, for example, a processing recipe stored in a storage medium built in the storage device or a storage medium set in the storage device.

[Operation of Refrigerant Supplier]

Next, the operation of the refrigerant supplier 200 according to the present embodiment will be described in detail with reference to FIGS. 2 and 5. As illustrated in FIG. 2, the refrigerant supplier 200 supplies the refrigerant gas to each inspection chamber row in each stage. The refrigerant supplier 200 causes the refrigerant gas output from the refrigerant gas output 65 to flow to the refrigerant gas pipes 60 extending to the inspection chamber row of each stage via the heat exchanger 70.

The refrigerant gas pipes 60 of the three stages connect in series the four inspection units 30 in the upper inspection space 12a, the four inspection units 30 in the middle inspection space 12b, and the four inspection units 30 in the lower inspection space 12c, respectively. Heat exchangers 70 (corresponding to a first heat exchanger) are disposed between refrigerant gas pipes 60 connecting adjacent inspection units 30. In addition, the heat exchangers 70 (corresponding to a second heat exchanger) are also disposed in the refrigerant gas pipes 60 connecting the refrigerant gas output 65 and each first inspection unit 30.

FIG. 5 is an enlarged view of one stage among the three stages of inspection chamber rows in FIG. 2. The refrigerant gas pipes 60 interconnect the chuck tops 36 of the four inspection units 30 installed in the inspection chamber row such that the four chuck tops 36 are connected in series. The refrigerant gas pipe 60 on the inlet side of each chuck top 36 is connected to a flow path 36a formed in each chuck top 36. The refrigerant gas supplied from the refrigerant gas pipe 60 on the inlet side flows into the flow path 36a in order to cool the wafer W on the chuck top 36. The flow path 36a is formed in, for example, a spiral shape. The flow path 36a in the chuck top 36 is connected to the refrigerant gas pipe 60 on the outlet side of each chuck top 36. The refrigerant gas flowing through the chuck tops 36 is discharged from the refrigerant gas pipe 60 on the outlet side of each chuck top 36.

Before a test, the temperature of the wafer W is adjusted to, for example, about 80 degrees C., but during the test, the temperature of the wafer W becomes 80 degrees C. or higher due to heat generation of the wafer W. The heat of the wafer W is dissipated by the refrigerant gas flowing through the flow path 36a disposed in the chuck top 36. As a result, the temperature of the refrigerant gas flowing through the flow path 36a rises.

For this reason, the refrigerant gas discharged from the refrigerant gas pipe 60 is heat-exchanged by the heat exchanger 70 before being supplied to the next chuck top 36, and is cooled to a predetermined temperature. In the refrigerant supplier 200 according to the present embodiment, the refrigerant gas flowing through the body 72 of the heat exchanger 70 is subjected to heat dissipation by the air sent from a fan 71 so that the refrigerant gas is cooled to, for example, about a room temperature of 25 degrees C., and the refrigerant is then supplied to the next chuck top 36. The air heated by the heat exchanger 70 is subjected to exhaust heat processing. In addition, the refrigerant gas discharged from the last chuck top 36 in the inspection chamber row is sent to the exhaust heat processing part 66 through the refrigerant gas pipe 60, and is subjected to exhaust heat processing by the exhaust heat processing part 66.

In the test, it is necessary to control the wafer W on the chuck top 36 to have a constant temperature. Therefore, it is preferable for the refrigerant gas supplied to each of the four chuck tops 36 in the inspection chamber row to have substantially the same temperature. By controlling the refrigerant gas supplied to each chuck top 36 to have the same temperature, it is possible to maintain the amount of heat removed from the wafer W by the refrigerant gas constant between the chuck tops 36. In addition, it is possible to maintain the temperature distribution of placement surfaces of the wafer W constant between the chuck tops 36.

For the above-described reasons, it is preferable to further install the heat exchanger 70 in each inspection chamber 24 and between the refrigerant gas output 65 and the chuck top 36. Even when the temperature of the refrigerant gas output from the refrigerant gas output 65 is not suitable, the temperature of the refrigerant gas supplied to the first chuck top 36 may be controlled to be the same as the temperature of the refrigerant gas supplied to the second and subsequent chuck tops 36 by the heat exchanger 70.

Each chuck top 36 includes the heater 62 and a temperature sensor 67 therein. The heater 62 heats the chuck top 36. The temperature sensor 67 detects the temperature of the chuck top 36.

In the inspection method using the inspection system 100 including the inspection chamber rows configured as described above, the wafers W are cooled by the refrigerant gas supplied from the refrigerant gas pipe 60 to the chuck top 36 for each inspection chamber row.

The temperature sensor 67 installed in each chuck top 36 detects the temperature of the chuck tops 36. The controller 90 controls the heater 62 of the corresponding chuck top 36 based on the temperature detected for each chuck top 36. As a result, even when the temperature of the wafer W is lower than a desired temperature to be controlled by the refrigerant gas, it is possible to control the temperature of each wafer W to be a desired temperature by raising the temperature using the heater 62.

Since the refrigerant gas pipe 60 is connected to the chuck tops 36 in series, the temperature of the refrigerant gas fluctuates while the refrigerant gas flows through the chuck tops 36 in the order of the first, second, third, and fourth chuck tops. Therefore, it is possible to control the temperatures of the four chuck tops 36 to be the same by heating each of the heaters 62 based on the temperature detected for each chuck top 36. In addition, even when it is possible to control the temperature and flow rate of the refrigerant gas supplied to the chuck tops 36 to be the same, the amount of heat generated from the wafers W on the chuck tops 36 under the test may vary in each inspection chamber 24. In that case, the temperatures of respective wafers W may be different from each other. Even in such a case, in the present embodiment, it is possible to control the wafers W of respective inspection chambers 24 to have the same temperature by appropriately heating the chuck tops 36 using respective heaters 62 based on the temperatures detected by temperature sensors 67.

A temperature sensor 67 is preferably installed on a placement surface of the wafer W (wafer placement surface) of each chuck top 36 so as to measure the wafer temperature. For example, it is preferable to dispose the temperature sensor 67 at or in a vicinity of the center of the wafer placement surface of the chuck top 36 such that the average value of the in-plane temperature distribution of the wafer W can be measured. In addition, it is preferable for the temperature sensor 67 to measure the temperature of the placement surface of the wafer W. This makes it possible to accurately measure the temperature of the wafer W using the temperature sensor 67. However, the temperature sensor 67 may be provided at any position in the chuck top 36 other than the wafer placement surface.

The refrigerant gas used in this embodiment is a gas, and no liquid refrigerant is supplied. In the inspection performed in each inspection chamber 24, the temperature within the inspection chamber 24 and the wafer temperature are, for example, about 80 degrees C. Therefore, as the refrigerant gas, for example, air, an inert gas such $N_2$ gas, or other gases may be used, as long as the gas is capable of lowering the wafer temperature from about 80 degrees C. to about 25 degrees C. The air may be dry air.

The amount of heat dissipation of the refrigerant gas differs depending on the maximum wind volume per unit time of the gas that can be supplied from the fan 71 of each heat exchanger 70 and the temperature of the gas. The temperature of the gas supplied from the fan 71 depends on the temperature within the refrigerant pipe arrangement space 27 shown in FIG. 2. Therefore, in order to lower the temperature of the refrigerant pipe arrangement space 27 itself, it is possible to make the refrigerant gas have a desired temperature (e.g., 30 degrees C.) by allowing the temperature of the clean room 300 to be taken into the refrigerant pipe arrangement space 27 and setting the refrigerant pipe arrangement space 27 to a temperature of, for example, about 25 degrees C.

Therefore, as illustrated in FIG. 2, windows 63a, 63b, and 63c communicating with the refrigerant pipe arrangement space 27 are formed in the housings 24b of the inspection chambers 24. The windows 63a, 63b, and 63c are opened to communicate with the clean room 300, and serve as a passage for taking in the air of the clean room 300 into the refrigerant pipe arrangement space 27.

The windows 63a allow the upper inspection spaces 12a of the upper stage to communicate with the outside of the inspection chamber row of the upper stage, and thus the air in the clean room 300 (the temperature of which is adjusted to, for example, 25 degrees C.) is introduced into the upper inspection spaces 12a and/or the refrigerant pipe arrangement space 27 of the upper stage. The windows 63b allow the middle inspection spaces 12b of the middle stage to communicate with the outside of the inspection chamber row of the middle stage, and thus the air of the clean room 300 is introduced into the middle inspection spaces 12b and/or the refrigerant pipe arrangement space 27 in the middle stage. The windows 63c allow the lower inspection spaces 12c of the lower stage to communicate with the outside of the inspection chamber row of the lower stage, and thus the air in the air of the clean room 300 is introduced into the lower inspection spaces 12c and/or the refrigerant pipe arrangement space 27 in the lower stage. As a result, it is possible to lower the temperatures within the upper inspection spaces 12a, the middle inspection spaces 12b, the lower inspection spaces 12c, and/or respective refrigerant pipe arrangement spaces 27 to the temperature of the air in the clean room 300 (e.g., 25 degrees C.). This makes it possible to use the air in the clean room 300, the temperature of which is lower than the temperature in the inspection chambers 24 (e.g., 50 degrees C.), as the gas that can be supplied from the fans 71 of the heat exchangers 70.

[Action/Effect]

In the related art, the heat of a wafer in an inspection chamber is removed by a coolant output from a chiller unit. In this case, the chiller unit and a pipe through which the coolant flows are large in size, resulting in an increase in footprint and an increase in cost.

For example, when the temperature of a wafer W is set to a low temperature of about −30 degrees C. and an inspection is performed, a chiller unit is required to control the temperature of the wafer W before the test. In contrast, in the present embodiment, for example, when the temperature of a wafer W is set to a high temperature (e.g., 50 degrees C.) equal to or higher than room temperature (25 degrees C.) and an inspection is performed, the refrigerant gas pipes 60 are arranged in a simpler method, and the wafer W is cooled by the refrigerant gas supplied to the refrigerant gas pipes 60. That is, the chuck tops 36 are connected in series by the refrigerant gas pipes 60 for each inspection chamber row, and the wafer W on each chuck top 36 is cooled by the refrigerant gas. Heat exchangers 70 are arranged between refrigerant gas pipes 60 arranged between chuck tops 36 to dissipate heat from the refrigerant gas passing through the heat exchangers 70. Therefore, when the amount of heat generated per wafer is 200 W or less, it is possible to dissipate heat from the wafer with a simpler configuration illustrated in the inspection system 100 of the present embodiment, and since a chiller unit or the like is not required, it is possible to reduce a footprint.

Furthermore, since the refrigerant gas is sequentially supplied to chuck tops 36 connected in series by the refrigerant gas pipes 60 for each stage of the inspection chamber row, it is possible to reduce the amount of the refrigerant gas compared with the case in which the refrigerant gas is separately supplied to each chuck top 36. This makes it possible to reduce the costs.

However, since chuck tops 36 are connected in series by the refrigerant gas pipes 60 for each inspection chamber row, a resistance factor when the refrigerant gas flows is large, and the pressure loss effect of the refrigerant gas is great. Therefore, it is necessary to increase the pressure of the refrigerant gas output from the refrigerant gas output 65. Therefore, for the refrigerant gas pipes 60, the present embodiment adopts a structure that is capable of withstanding the pressure of the refrigerant gas output from the refrigerant gas output 65.

As described above, according to the inspection apparatus and inspection method of the present embodiment, it is possible to remove heat from wafers in the inspection chambers with a simple structure.

It should be considered that the inspection apparatus and the inspection method according to the embodiment disclosed herein are illustrative and not restrictive in all aspects. The embodiment described above may be modified and improved in various forms without departing from the scope and spirit of the appended claims. The matters described in the above embodiment may take other configurations without contradiction, and may be combined without contradiction.

According to the present disclosure, it is possible to remove the heat of a wafer in an inspection chamber with a simple structure.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An inspection apparatus comprising:
   inspection chamber rows in each of which inspection chambers are arranged, the inspection chamber rows being arranged in multiple stages and each of the inspection chambers being configured to accommodate therein a tester configured to inspect an inspection object on a chuck top;
   a refrigerant supplier configured to supply a refrigerant gas; and
   a controller,
   wherein the refrigerant supplier includes:
   a refrigerant gas pipe connecting the chuck tops in each inspection chamber row to allow the refrigerant gas to pass therethrough; and
   a first heat exchanger disposed in the refrigerant gas pipe between two adjacent chuck tops in each inspection chamber row to exchange heat with the refrigerant gas discharged from the chuck tops,
   wherein each of the chuck tops includes a heater configured to heat the inspection object and a temperature sensor,
   wherein the controller is configured to control the heater in each of the chuck tops based on a temperature detected by the temperature sensor in each of the chuck tops,
   wherein each of the inspection chambers includes a window formed in a housing of the inspection chambers and the window is opened to communicate with both a refrigerant gas pipe arrangement space formed in the housing of the inspection chambers and an outside of the inspection chamber rows, and
   wherein each of the inspection chambers is configured such that clean room air in the outside is capable of being introduced into the inspection chamber from the window.

2. The inspection apparatus of claim 1, wherein each of the chuck tops includes a placement surface where the inspection object is placed, and
   wherein the temperature sensor is installed on the placement surface.

3. The inspection apparatus of claim 1, wherein the refrigerant supplier further includes a refrigerant output,
   wherein the refrigerant gas pipe further connects the refrigerant output and a first chuck top, and
   wherein each of the inspection chamber rows includes a second heat exchanger disposed in the refrigerant gas pipe connecting the refrigerant output and the first chuck top so as to exchange heat with the refrigerant gas that is output from the refrigerant output.

4. The inspection apparatus of claim 3, wherein the refrigerant gas that is output from the second heat exchanger is supplied to the first chuck top connected to the refrigerant gas pipe in each inspection chamber row.

5. The inspection apparatus of claim 1, wherein the refrigerant gas that is output from the first heat exchanger is supplied to the chuck top subsequently connected to the refrigerant gas pipe in each inspection chamber row.

6. An inspection method using an inspection system including inspection chamber rows in each of which inspection chambers are arranged, the inspection chamber rows arranged in multiple stages, each of the inspection chambers being configured accommodate therein a tester configured to inspect an inspection object on a chuck top and including a window formed in a housing of the inspection chambers, and the window being opened to communicate with both a refrigerant gas pipe arrangement space formed in the housing of the inspection chambers and an outside of the inspection chamber rows, the inspection method comprising:
   supplying a refrigerant gas to a refrigerant gas pipe that connects the chuck tops in each inspection chamber row;
   causing a first heat exchanger disposed in the refrigerant gas pipe between two adjacent chuck tops in each inspection chamber row to exchange heat with the refrigerant gas discharged from the chuck tops; and
   controlling a heater installed in each of the chuck tops based on a temperature detected by a temperature sensor installed in each of the chuck tops,
   wherein each of the inspection chambers is configured such that clean room air in the outside is capable of being introduced into the inspection chamber from the window.

* * * * *